US012655301B2

(12) United States Patent
Xiao

(10) Patent No.: US 12,655,301 B2
(45) Date of Patent: Jun. 16, 2026

(54) ENCAPSULATION MATERIAL, DISPLAY PANEL, AND ENCAPSULATION METHOD THEREOF

(71) Applicant: TCL CHINA STAR OPTOELECTRONICS TECHNOLOGY CO., LTD., Shenzhen (CN)

(72) Inventor: Xie Xiao, Shenzhen (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 786 days.

(21) Appl. No.: 17/897,279

(22) Filed: Aug. 29, 2022

(65) Prior Publication Data

US 2024/0052177 A1 Feb. 15, 2024

(30) Foreign Application Priority Data

Aug. 5, 2022 (CN) ........................ 202210938827.1

(51) Int. Cl.
*C09D 4/06* (2006.01)
*C08F 220/18* (2006.01)
(Continued)

(52) U.S. Cl.
CPC ................ *C09D 4/06* (2013.01); *C09D 7/48* (2018.01); *C09D 133/04* (2013.01);
(Continued)

(58) Field of Classification Search
None
See application file for complete search history.

(56) References Cited

U.S. PATENT DOCUMENTS 4,726,877 A * 2/1988 Fryd ...................... G03F 7/027 430/315
2017/0253780 A1* 9/2017 Wang .................... C09J 175/16

FOREIGN PATENT DOCUMENTS

CN 87100720 8/1987
CN 101970590 2/2011
(Continued)

OTHER PUBLICATIONS

Gorshe et al., Difunctional vinyl sulfonate esters for the fabrication of tough methacrylate-based photopolymer networks, Polymer, vol. 158, pp. 149-157 (2018). (Year: 2018).*
(Continued)

*Primary Examiner* — Ha S Nguyen

(57) ABSTRACT

Embodiments of the present application disclose an encapsulation material, a display panel, and an encapsulation method. By mass percentage, the encapsulation material includes a main resin, 20%-50%; a dilute monomer, 20%-50%; a stabilizer, 0.01%-2%; a microgel, 1%-10%; a chain transfer agent, 0.01%-5%; and an initiator in a remaining percentage balance. The encapsulation material can be cured under action of UV light to form an encapsulation layer, anti-aging performance of the encapsulation layer can be improved, and toughness can be enhanced to reduce warpage. The microgel structure can enhance the toughness of the encapsulation layer and make it have excellent corrosion resistance. Ester activated vinyl sulfonate is used as the chain transfer agent to make an average chain length in a polymer network shorter, reduce a risk of shrinkage cracks appearing during curing, and enhance the toughness of the encapsulation layer after the curing.

13 Claims, 3 Drawing Sheets

(51) Int. Cl.

| | |
|---|---|
| ***C08F 220/34*** | (2006.01) |
| ***C08F 222/10*** | (2006.01) |
| ***C08F 265/06*** | (2006.01) |
| ***C08F 290/06*** | (2006.01) |
| ***C09D 7/48*** | (2018.01) |
| ***C09D 133/04*** | (2006.01) |
| ***C09D 135/02*** | (2006.01) |
| ***C09D 163/10*** | (2006.01) |
| ***C09D 167/06*** | (2006.01) |
| ***C09D 175/14*** | (2006.01) |
| ***C09J 163/10*** | (2006.01) |
| ***H10H 20/854*** | (2025.01) |
| ***H10W 90/00*** | (2026.01) |

(52) U.S. Cl.

CPC ......... *C09D 135/02* (2013.01); *C09D 163/10* (2013.01); *C09D 167/06* (2013.01); *C09D 175/14* (2013.01); *H10H 20/854* (2025.01); *H10W 90/00* (2026.01)

(56) References Cited

FOREIGN PATENT DOCUMENTS

| | | | | |
|---|---|---|---|---|
| CN | 107452891 | | 12/2017 | |
| CN | 112368344 | | 2/2021 | |
| CN | 113683998 A | * | 11/2021 | ............ C09J 175/14 |

OTHER PUBLICATIONS

Seidler et al., "Vinyl Sulfonate Esters: Efficient Chain Transfer Agents for the 3D Printing of Tough Photopolymers without Retardation," Angewandte Chemie International Edition, vol. 57, pp. 9165-9169 (2018). (Year: 2018).*

Notification of Office Action and Search Report Dated Mar. 31, 2023 From the State Intellectual Property Office of the People's Republic of China Re. Application No. 202210938827.1 and Its Translation Into English. (19 Pages).

* cited by examiner

ENCAPSULATION MATERIAL, DISPLAY PANEL, AND ENCAPSULATION METHOD THEREOF

RELATED APPLICATIONS

This application claims the benefit of priority of Chinese Patent Application No. 202210938827.1 filed on Aug. 5, 2022, the contents of which are incorporated by reference as if fully set forth herein in their entirety.

FIELD OF ART

The present application relates to a field of display technology, and more specifically to an encapsulation material, a display panel, and an encapsulation method thereof.

BACKGROUND OF DISCLOSURE

With development of science and technology and improvement of living standards, people are pursuing display devices with high resolution, thinness, high color gamut, and high brightness. In such a background, flexible and self-luminous technologies are gradually replacing traditional rigid liquid crystal display (LCD) technologies. Existing self-luminous technologies are mainly divided into inorganic semiconductor self-luminous (micro/mini-LEDs) and organic semiconductor self-luminous (organic light emitting diodes, OLEDs) technologies. Among them, the micro/mini-LED technology has become a research hotspot due to its simple structure, high stability, and high luminous efficiency. However, in order to achieve refined, large-scale, and low-cost displays, the micro/mini-LEDs need to be driven by thin film transistors (TFTs) on a substrate such as glass or plastic that can be mass-produced in large sizes, like LCDs and the OLEDs. Based on this, the TFTs and the micro/mini-LEDs will be important directions for mass production.

For a current technical solution of a TFT substrate driving the mini-LEDs, since it does not need to package a MOS transistor and an LED lamp together, and size of a device can also be reduced, so it also has advantages in achieving a smaller pixel pitch. Therefore, splicing screen technology that uses the TFT substrate to drive the mini-LEDs has greater advantage. Wherein TFT technology generally includes hydrogenated amorphous silicon TFT technology (a-Si: H TFT), amorphous oxide TFT technology, and low-temperature polysilicon TFT technology. The hydrogenated amorphous silicon TFT technology, due to low carrier mobility, is difficult to meet driving requirements of the mini-LEDs. Compared with the amorphous oxide TFT technology, the low-temperature polysilicon TFT technology has a complex fabrication process, lower generation lines, and higher cost.

Therefore, a splicing screen using amorphous oxide TFTs to drive the mini-LEDs has become mainstream. However, since a mini-LED display panel is only coated with an encapsulant after the LED lamp is solidified, and the encapsulant has poor barrier ability to water and oxygen, it cannot meet encapsulation requirements of the amorphous oxide TFTs. Amorphous oxide materials easily absorb water and oxygen in the environment, which will lead to failure of encapsulation of the device and affect performance of the device.

SUMMARY OF DISCLOSURE

In order to achieve above objects, the present invention provides an encapsulation material, a display panel, and an encapsulation method thereof to solve a technical problem that an encapsulation effect of an existing display panel is poor and encapsulation requirements of oxide TFTs are difficult to meet.

In order to achieve above objects, the present invention provides an encapsulation material. By mass percentage, the encapsulation material includes: a main resin, 20%-50%; a dilute monomer, 20%-50%; a stabilizer, 0.01%-2%; a microgel, 1%-10%; a chain transfer agent, 0.01%-5%; and an initiator in a remaining percentage balance.

Further, the main resin includes at least one of epoxy acrylate, urethane acrylate, pure acrylate, or polyester acrylate.

Further, the dilute monomer includes at least one of a monofunctional monomer, a difunctional monomer, or a multifunctional monomer. Wherein, functionalities of the monofunctional monomer, the difunctional monomer, and the multifunctional monomer are greater than or equal to 3. The monofunctional monomer includes at least one of styrene or methyl methacrylate. The difunctional monomer includes 1,6-hexanediol acrylate. The multifunctional monomer includes at least one of trimethylol triacrylate or pentaerythritol tetraacrylate.

Further, the stabilizer includes at least one of an organic tin stabilizer, a calcium zinc stabilizer, an organic chelate compound, or a UV stabilizer.

Further, the microgel includes at least one of ethylene-diethylene glycol diacrylate or styrene-trimethylolpropane triacrylate.

Further, the chain transfer agent includes ester activated vinyl sulfonate.

Further, the initiator includes at least one of a hydrogen abstraction free radical photoinitiator or a macromolecular photoinitiator.

In order to achieve above objects, the present invention further provides a display panel. The display panel includes: a substrate; a thin film transistor layer being disposed on one surface of the substrate; a light-emitting layer being disposed on one surface of the thin film transistor layer away from the substrate, and the light-emitting layer including at least two light-emitting units disposed at intervals; and a first encapsulation layer being disposed on the light-emitting layer and filling a gap between two adjacent ones of the light-emitting units. Wherein the first encapsulation layer is made of the aforementioned encapsulation material.

Further, the display panel further includes: a second encapsulation layer being disposed on one surface of the first encapsulation layer away from the substrate. Wherein, the second encapsulation layer includes: an adhesive layer being disposed on the surface of the first encapsulation layer away from the substrate; a first barrier layer being disposed on one surface of the adhesive layer away from the substrate; and a second barrier layer being disposed on one surface of the first barrier layer away from the substrate.

Further, a material used for the adhesive layer is a pressure-sensitive adhesive. A material used for the first barrier layer is polyethylene terephthalate or polyimide. A material used for the second barrier layer is at least one of epoxy, polyurethane, polyester, or acrylic.

In order to achieve above objects, the present invention further provides an encapsulation method of a display panel. The encapsulation method includes following steps:

- preparing the display panel; wherein the display panel includes a substrate, a thin film transistor layer, and a light-emitting layer; the thin film transistor layer is formed on the substrate; the light-emitting layer is formed on the thin film transistor layer, and the light-emitting layer includes at least two light-emitting units disposed at intervals; and forming an encapsulation layer on the light-emitting layer and filling a gap between two adjacent ones of the light-emitting units; wherein, by mass percentage, the encapsulation layer is composed of following components: a main resin, 20%-50%; a dilute monomer, 20%-50%; a stabilizer, 0.01%-2%; a microgel, 1%-10%; a chain transfer agent, 0.01%-5%; and an initiator in a remaining percentage balance.

Any one of the above-mentioned technical solutions has the following advantages or beneficial effects: the encapsulation material, the display panel, and the encapsulation method thereof are provided. The encapsulation material can be cured under the action of UV light to form the encapsulation layer, anti-aging performance of the encapsulation layer can be improved, and the toughness can be enhanced to reduce warpage. The encapsulation layer is a UV layer with a high functionality and a microgel structure. Wherein the microgel structure can enhance the toughness of the encapsulation layer and make it have excellent corrosion resistance. The ester activated vinyl sulfonate is used as the chain transfer agent, so that an average chain length in a polymer network is made shorter, reducing the risk of shrinkage cracks appearing during curing, and enhancing the toughness of the encapsulation layer after curing.

Further, the display panel adopts double encapsulation layers, and the first encapsulation layer and the second encapsulation layer can be firmly attached together through the adhesive layer. Therefore, when the display panel is intruded by water and oxygen, the second encapsulation layer at an outermost periphery of the light-emitting layer has double barrier layers, which can effectively block the intrusion of water and oxygen. The first encapsulation layer disposed between the light-emitting layer and the second encapsulation layer has high anti-aging performance, strong toughness, and small warpage, thereby further reducing the impact of water and oxygen in the environment on the display panel, improving the water and oxygen barrier ability, meeting the encapsulation requirements of the oxide TFT, and then improving the stability and anti-aging performance of the display panel.

DESCRIPTION OF DRAWINGS

For more clearly illustrating the technical solutions in the embodiments of the present application, the following will briefly introduce the accompanying drawings used in the description of the embodiments. It is obvious that the accompanying drawings in the following description are only a part of the embodiments of the present application, from which those skilled in the art can derive further figures without making any inventive efforts.

REFERENCE NUMBER

Figure 1:
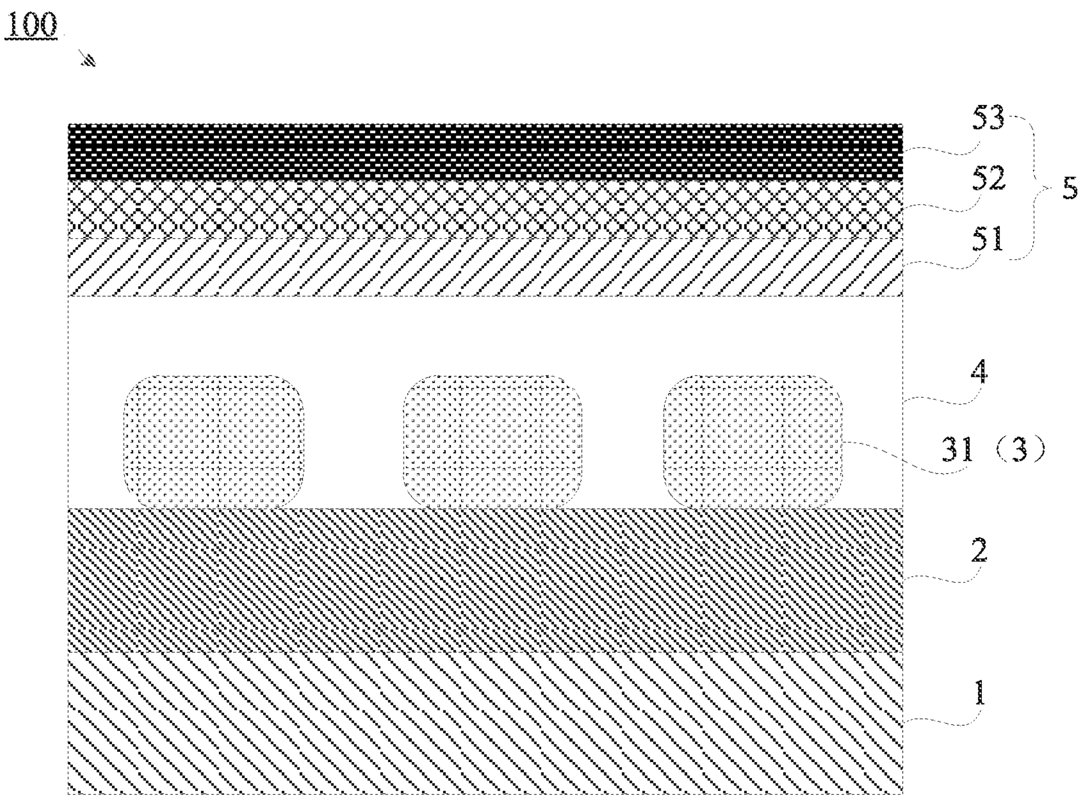
FIG. 1 is a structural schematic diagram of a display panel according to embodiments of the present application.

| | |
|---|---|
| display panel 100; | substrate 1; |
| thin film transistor layer 2; | light-emitting layer 3; |
| light-emitting unit 31; | first encapsulation layer 4; |
| second encapsulation layer 5; | adhesive layer 51; |
| first barrier layer 52; | second barrier layer 53. |

DETAILED DESCRIPTION OF PREFERRED EMBODIMENTS

The technical solutions in the embodiments of the present application will be clearly and completely described below with reference to the accompanying drawings in the embodiments of the present application. Obviously, the described embodiments are only a part of the embodiments of the present application, but not all of the embodiments. Based on the embodiments in the present application, all other embodiments obtained by those skilled in the art without creative work fall within the protection scope of the present application.

In the present application, unless otherwise expressly specified and defined, a first feature is "on" or "under" a second feature, this means that the first feature and the second feature are in direct contact or indirect contact. For example, the first feature and the second feature may be in contact with another feature between them. In addition, the first feature is "above", "over" and "on the top of" the second feature, this means that the first feature is directly above and diagonally above the second feature, or only means that the level of the first feature is higher than the level of the second feature. The first feature is "below", "under" and "on the bottom of" the second feature, this means that the first feature is directly below and diagonally below the second feature, or only means that the level of the first feature is smaller than the level of the second feature.

The embodiment provides an encapsulation material. By mass percentage, the encapsulation material includes: a main resin, 20%-50%; a dilute monomer, 20%-50%; a stabilizer, 0.01%-2%; a microgel, 1%-10%; a chain transfer agent, 0.01%-5%; and an initiator in a remaining percentage balance. Wherein, in a process of forming an encapsulation layer using the encapsulation material, mass parts of above components can be reasonably selected according to user's actual needs.

Specifically, the main resin includes at least one of an epoxy acrylate, a urethane acrylate, a pure acrylate, or a polyester acrylate, and has good adhesion, toughness, and corrosion resistance.

The dilute monomer includes at least one of a monofunctional monomer, a difunctional monomer, or a multifunctional monomer, and these monomers mainly play a role of diluting in the system. Wherein, functionalities of the monofunctional monomer, the difunctional monomer, and the multifunctional monomer are greater than or equal to 3. The monofunctional monomer includes at least one of styrene or methyl methacrylate. The difunctional monomer includes 1,6-Hexanediol acrylate. The multifunctional monomer includes at least one of trimethylol triacrylate or pentaerythritol tetraacrylate.

The stabilizer includes at least one of an organic tin stabilizer, a calcium zinc stabilizer, an organic chelate compound (such as ferrocene), or a UV stabilizer (such as UV-P, UV-O, etc.). The stabilizer has effects of high temperature resistance and ultraviolet radiation (ultraviolet, UV) aging resistance.

The microgel includes at least one of ethylene-diethylene glycol diacrylate or styrene-trimethylolpropane triacrylate. The microgel can make the encapsulation material have a microgel structure, so that a formed polymer (i.e., the encapsulation material) has enhanced toughness, and the encapsulation layer has excellent corrosion resistance.

The chain transfer agent includes ester activated vinyl sulfonate, and a molecular structure formula of which is:

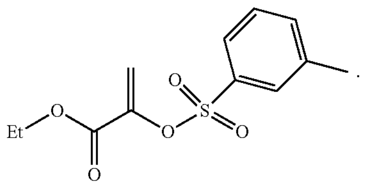 [SMILES: C=C(OS(=O)(=O)c1cccc(C)c1)C(=O)OCC]

The ester activated vinyl sulfonate is used as the chain transfer agent, so that an average chain length in a polymer network is made be shorter. During a process of curing the encapsulation material to form the encapsulation layer, the ester activated vinyl sulfonate can reduce a risk of shrinkage cracks, enhance the toughness, and prevent warpage.

The initiator adopts a cleavage free radical photoinitiator, and includes a hydrogen abstraction free radical photoinitiator, or a macromolecular photoinitiator. According to a classification of the initiator, a class of the initiator can be 754, 184, 1173, etc.

The embodiment provides the encapsulation material. The encapsulation material can be cured under the action of UV light to form the encapsulation layer, anti-aging performance of the encapsulation layer can be improved, and the toughness can be enhanced to reduce warpage. The encapsulation layer is a UV layer with a high functionality and a microgel structure. Wherein, the microgel structure can enhance the toughness of the encapsulation layer and make it have excellent corrosion resistance. The ester activated vinyl sulfonate is used as the chain transfer agent, so that an average chain length in a polymer network is made shorter, the risk of shrinkage cracks appearing during curing is reduced, and the toughness of the encapsulation layer after curing is enhanced.

As shown in FIG. 1, the embodiment further provides a display panel 100, including a substrate 1, a thin film transistor layer 2, a light-emitting layer 3, a first encapsulation layer 4, and a second encapsulation layer 5.

The substrate 1 may be a flexible substrate or a rigid substrate, which is not particularly limited here.

The thin film transistor layer 2 is disposed on an upper surface of the substrate 1. The thin film transistor layer 2 includes multiple thin film transistors (TFT, not shown in figures). Each of the TFTs includes an active layer, a gate, a source, a drain, and other components. A material used in the active layer is amorphous oxide, such as indium gallium zinc oxide (IGZO), and a carrier mobility is 20-30 times that of amorphous silicon, which can greatly improve a charging and discharging rate of the TFTs to pixel electrodes, improve a response speed of pixels, and achieve a faster refresh rate. Moreover, the faster response speed also greatly increases a line scan rate of the pixels, and makes ultra-high resolution be possible in TFT-LCDs. In addition, due to a reduced number of the transistors and increased light transmittance of each of the pixels, IGZO display panels have a higher level of energy efficiency and are more efficient.

The light-emitting layer 3 is disposed on an upper surface of the thin film transistor layer 2. The light-emitting layer 3 includes at least two light-emitting units 31 disposed at intervals. In the embodiment, multiple of the light-emitting units 31 are arranged in an array on the thin film transistor layer 2. The light-emitting units 31 may be mini-LED chips or micro-LED chips.

The first encapsulation layer 4 is disposed on the light-emitting layer 3 and fills a gap between two adjacent ones of the light-emitting units 31. The first encapsulation layer 4 is made of the aforementioned encapsulation material. In a process of forming the first encapsulation layer 4, the encapsulation material is coated on the light-emitting units 31, and fills the gap between two adjacent ones of the light-emitting units 31, and then the encapsulation material is cured to form the first encapsulation layer 4 under the action of the UV light. Wherein the first encapsulation layer 4 is the UV layer with the high functionality and the microgel structure. The first encapsulation layer 4 adopts the microgel structure, thereby enhancing the toughness of the encapsulation layer and making it have excellent corrosion resistance. Using the ester activated vinyl sulfonate as the chain transfer agent can make an average chain length in a polymer network shorter, reduce the risk of shrinkage cracks appearing during curing, and enhance the toughness of the encapsulation layer after curing, thereby preventing water and oxygen from intruding the light-emitting layer 3, preventing a problem of packaging failure, and improving a packaging yield of the display panel 100.

The second encapsulation layer 5 is disposed on an upper surface of the first encapsulation layer 4. The second encapsulation layer 5 includes an adhesive layer 51, a first barrier layer 52, and a second barrier layer 53.

Specifically, the adhesive layer 51 is disposed on the upper surface of the first encapsulation layer 4. A material used for the adhesive layer 51 is a pressure-sensitive adhesive, which plays a role of bonding.

The first barrier layer 52 is disposed on an upper surface of the adhesive layer 51. A material used for the first barrier layer 52 is polyethylene terephthalate or polyimide, which can block water and oxygen.

The second barrier layer 53 is disposed on one surface of the first barrier layer 52 away from the substrate 1. A material used for the second barrier layer 53 is at least one of epoxy (such as SiO2 modified epoxy resin), polyurethane, polyester, or acrylic, which can further block water and oxygen.

The display panel 100 provided by the embodiment adopts double encapsulation layers, and the first encapsulation layer 4 and the second encapsulation layer 5 can be firmly attached together through the adhesive layer 51. Therefore, when the display panel 100 is intruded by water and oxygen, the second encapsulation layer 5 at an outermost periphery of the light-emitting layer 3 has double barrier layers, which can effectively block the intrusion of water and oxygen. The first encapsulation layer 4 disposed between the light-emitting layer 3 and the second encapsulation layer 5 has high anti-aging performance, strong toughness, and small warpage, thereby further reducing the impact of water and oxygen in the environment on the display panel 100, improving the water and oxygen barrier ability, meeting the encapsulation requirements of oxide TFTs, and further improving the stability and anti-aging performance of the display panel 100.

Figure 2:
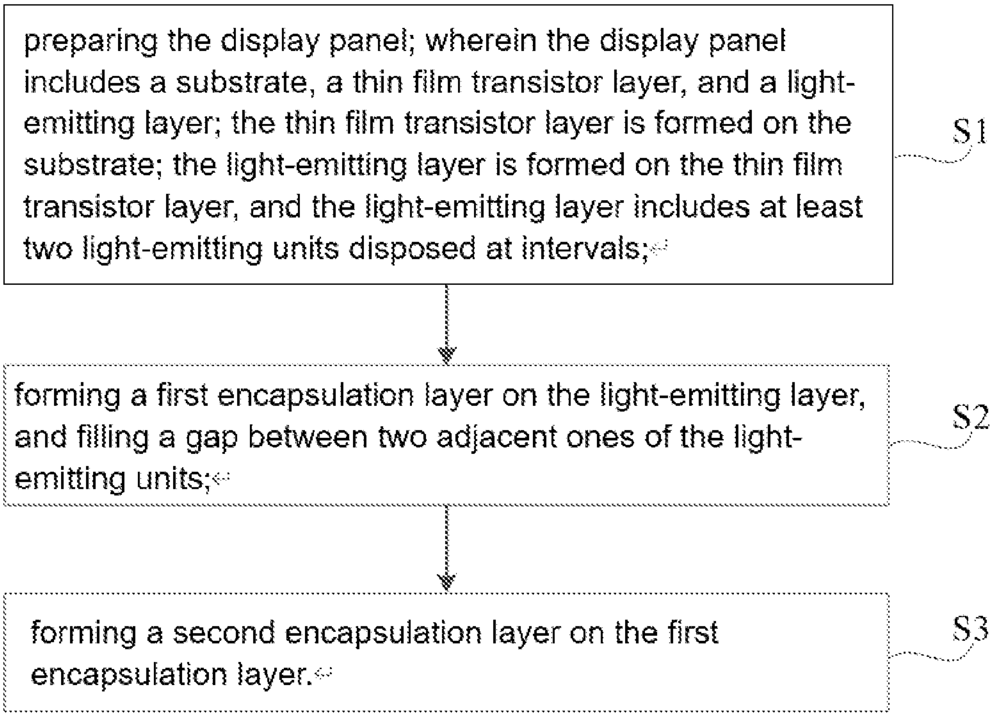
FIG. 2 is a flow chart of an encapsulation method of the display panel according to the embodiments of the present application.

As show in FIG. 2, the embodiment further provides an encapsulation method of the display panel, including following steps S1)-S3).

The step S1) is preparing the display panel; wherein the display panel includes a substrate 1, a thin film transistor layer 2, and a light-emitting layer 3. The thin film transistor layer 2 is formed on the substrate 1; the light-emitting layer 3 is formed on the thin film transistor layer 2, and the light-emitting layer includes at least two light-emitting units disposed at intervals, referring to FIG. 1.

The step S2) is forming a first encapsulation layer 4 on the light-emitting layer 3, referring to FIG. 1, and filling a gap between two adjacent ones of light-emitting units 31; wherein by mass percentage, the first encapsulation layer 4 is composed of following components: a main resin, 20%-50%; a dilute monomer, 20%-50%; a stabilizer, 0.01%-2%; a microgel, 1%-10%; a chain transfer agent, 0.01%-5%; and an initiator in a remaining percentage balance.

The main resin includes at least one of an epoxy acrylate, a urethane acrylate, a pure acrylate, or a polyester acrylate, and has good adhesion, toughness, and corrosion resistance.

The dilute monomer includes at least one of a monofunctional monomer, a difunctional monomer, or a multifunctional monomer, and these monomers mainly play a role of diluting in the system. Wherein, functionalities of the monofunctional monomer, the difunctional monomer, and the multifunctional monomer are greater than or equal to 3. The monofunctional monomer includes at least one of styrene or methyl methacrylate. The difunctional monomer includes 1,6-Hexanediol acrylate. The multifunctional monomer includes at least one of trimethylol triacrylate or pentaerythritol tetraacrylate.

The stabilizer includes at least one of an organic tin stabilizer, a calcium zinc stabilizer, an organic chelate compound (such as ferrocene), or a UV stabilizer (such as UV-P, UV-O, etc.). The stabilizer has effects of high temperature resistance and ultraviolet radiation (ultraviolet, UV) aging resistance.

The microgel includes at least one of ethylene-diethylene glycol diacrylate or styrene-trimethylolpropane triacrylate. The microgel can make the encapsulation material have a microgel structure, so that a formed polymer (i.e., the encapsulation material) has enhanced toughness, and the encapsulation layer has excellent corrosion resistance.

The chain transfer agent includes ester activated vinyl sulfonate, and a molecular structure formula of which is:

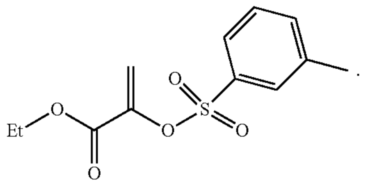 [SMILES: C=C(OS(=O)(=O)c1cccc(C)c1)C(=O)OCC]

The ester activated vinyl sulfonate is used as the chain transfer agent, so that an average chain length in a polymer network is made be shorter. During a process of curing the encapsulation material to form the encapsulation layer, the ester activated vinyl sulfonate can reduce the risk of shrinkage cracks, enhance the toughness, and prevent warpage.

The initiator adopts a cleavage free radical photoinitiator, and includes a hydrogen abstraction free radical photoinitiator, or a macromolecular photoinitiator. According to a classification of the initiator, a class of the initiator can be 754, 184, 1173, etc.

The step S3) is forming a second encapsulation layer 5 on the first encapsulation layer 4. Please refer to FIG. 1.

Figure 3:
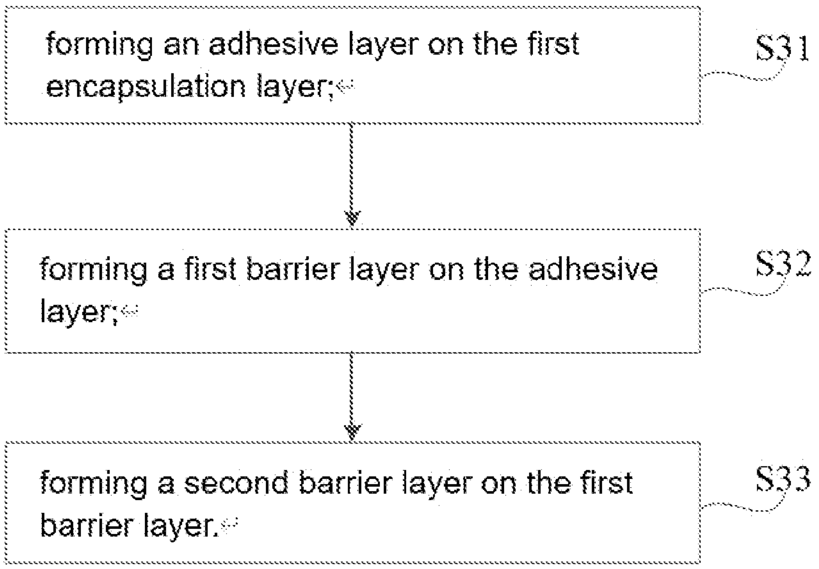
FIG. 3 is a flow chart of steps of forming a second encapsulation layer according to the embodiments of the present application.

As shown in FIG. 3, the step of forming the second encapsulation layer 5 includes steps S31) to S33).

The step S31) is forming an adhesive layer 51 on the first encapsulation layer 4, referring to FIG. 1. A material used for the adhesive layer 51 is a pressure-sensitive adhesive, which plays a role of bonding.

The step S32) is forming a first barrier layer 52 on the adhesive layer 51, referring to FIG. 1. A material used for the first barrier layer 52 is polyethylene terephthalate or polyimide, which can block water and oxygen.

The step S33) is forming a second barrier layer 53 on the first barrier layer 52, referring to FIG. 1. A material used for the second barrier layer 53 is at least one of epoxy (such as SiO2 modified epoxy resin), polyurethane, polyester, or acrylic, which can further block water and oxygen.

The encapsulation method of the display panel provided by the embodiment adopts double encapsulation layers, and the first encapsulation layer and the second encapsulation layer can be firmly attached together through the adhesive layer. Therefore, when the display panel is intruded by water and oxygen, the second encapsulation layer at an outermost periphery of the light-emitting layer has double barrier layers, which can effectively block the intrusion of water and oxygen. The first encapsulation layer disposed between the light-emitting layer and the second encapsulation layer has high anti-aging performance, strong toughness, and small warpage, thereby further reducing the impact of water and oxygen in the environment on the display panel, improving the water and oxygen barrier ability, meeting the encapsulation requirements of the oxide TFTs, and further improving the stability and the anti-aging performance of the display panel.

Further, the embodiment also provides a spliced screen, which is composed of a plurality of the aforementioned display panels spliced into a large-sized display screen, that is, the splicing screen. The spliced screen has double encapsulation layers, which can effectively reduce the influence of water and oxygen in the environment on the light-emitting layer (micro/mini-LED chips), thereby improving stability of the splicing screen and preventing aging of the splicing screen.

The above is the detailed introduction of the encapsulation material, the display panel, and the encapsulation method thereof provided by the embodiments of the present application. The principles and implementations of the present application are described herein using specific examples. The descriptions of the above embodiments are only used to help understand the methods and core ideas of the present application. Moreover, for those skilled in the art, according to the idea of the present application, there will be changes in the specific embodiments and application scope. In summary, the content of this specification should not be construed as a limitation to the present application.

What is claimed is:

1. An encapsulation material, by mass percentage, comprising:

a main resin, 20%-50%;
a dilute monomer, 20%-50%;
a stabilizer, 0.01%-2%;
a microgel, 1%-10%;
a chain transfer agent, 0.01%-5%; and
an initiator, in a remaining percentage balance;
wherein the chain transfer agent comprises ester activated vinyl sulfonate, and a molecular structure formula of the ester activated vinyl sulfonate is:

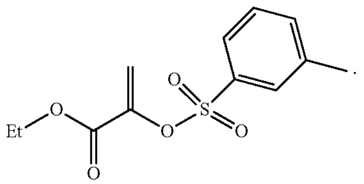 [SMILES: C=C(OS(=O)(=O)c1cccc(C)c1)C(=O)OCC]

2. The encapsulation material according to claim 1, wherein the main resin comprises at least one of epoxy acrylate, urethane acrylate, acrylate, or polyester acrylate.

3. The encapsulation material according to claim 1, wherein the dilute monomer comprises at least one of a monofunctional monomer, a difunctional monomer, or a multifunctional monomer;

wherein functionality of the multifunctional monomer is greater than or equal to 3.

4. The encapsulation material according to claim 1, wherein the stabilizer comprises at least one of an organic tin stabilizer, a calcium zinc stabilizer, an organic chelate compound, or a UV stabilizer.

5. The encapsulation material according to claim 1, wherein the microgel comprises at least one of ethylene-diethylene glycol diacrylate or styrene-trimethylolpropane triacrylate.

6. The encapsulation material according to claim 1, wherein the initiator comprises at least one of a hydrogen abstraction free radical photoinitiator or a macromolecular photoinitiator.

7. A display panel, comprising:

a substrate;

a thin film transistor layer being disposed on one surface of the substrate;

a light-emitting layer being disposed on one surface of the thin film transistor layer away from the substrate, and the light-emitting layer comprising at least two light-emitting units disposed at intervals; and a first encapsulation layer being disposed on the light-emitting layer and filling a gap between two adjacent ones of the light-emitting units;

wherein the first encapsulation layer is made of an encapsulation material, the encapsulation material comprises by mass percentage:

a main resin, 20%-50%;

a dilute monomer, 20%-50%;

a stabilizer, 0.01%-2%;

a microgel, 1%-10%;

a chain transfer agent, 0.01%-5%; and an initiator, in a remaining percentage balance;

wherein the chain transfer agent comprises ester activated vinyl sulfonate, and a molecular structure formula of the ester activated vinyl sulfonate is:

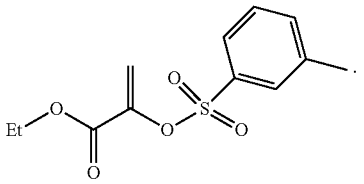 [SMILES: C=C(OS(=O)(=O)c1cccc(C)c1)C(=O)OCC]

8. The display panel according to claim 7, wherein the display panel further comprises:

a second encapsulation layer being disposed on one surface of the first encapsulation layer away from the substrate;

wherein the second encapsulation layer comprises:

an adhesive layer being disposed on the surface of the first encapsulation layer away from the substrate;

a first barrier layer being disposed on one surface of the adhesive layer away from the substrate; and a second barrier layer being disposed on one surface of the first barrier layer away from the substrate.

9. The display panel according to claim 8, wherein a material used for the adhesive layer is a pressure-sensitive adhesive;

a material used for the first barrier layer is polyethylene terephthalate or polyimide; and a material used for the second barrier layer is at least one of epoxy, polyurethane, polyester, or acrylic.

10. An encapsulation method of a display panel, comprising following steps:

preparing the display panel; the display panel comprising a substrate, a thin film transistor layer, and a light-emitting layer; the thin film transistor layer being formed on the substrate; the light-emitting layer being formed on the thin film transistor layer, and the light-emitting layer comprising at least two light-emitting units disposed at intervals; and forming an encapsulation layer on the light-emitting layer and filling a gap between two adjacent ones of the light-emitting units; wherein the encapsulation layer is composed of following components, by mass percentage:

a main resin, 20%-50%;

a dilute monomer, 20%-50%;

a stabilizer, 0.01%-2%;

a microgel, 1%-10%;

a chain transfer agent, 0.01%-5%; and an initiator, in a remaining percentage balance;

wherein the chain transfer agent comprises ester activated vinyl sulfonate, and a molecular structure formula of the ester activated vinyl sulfonate is:

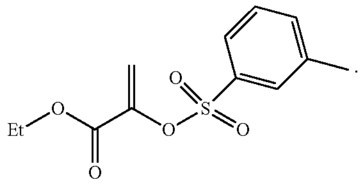 [SMILES: C=C(OS(=O)(=O)c1cccc(C)c1)C(=O)OCC]

11. The encapsulation material according to claim 3, wherein the monofunctional monomer comprises at least one of styrene or methyl methacrylate.

12. The encapsulation material according to claim 3, wherein the difunctional monomer comprises 1,6-hexanediol acrylate.

13. The encapsulation material according to claim 3, wherein the multifunctional monomer comprises at least one of trimethylolpropane triacrylate or pentaerythritol tetraacrylate.

* * * * *